US012642147B2

(12) United States Patent
Zimer et al.

(10) Patent No.: US 12,642,147 B2
(45) Date of Patent: May 26, 2026

(54) DIODE WALL INTEGRATED ON COOLER

(71) Applicant: TRUMPF Photonics, Inc., Cranbury, NJ (US)

(72) Inventors: Hagen Zimer, Dunningen-Seedorf (DE); Thilo Vethake, Roosevelt, NJ (US); Tobias Barnowski, East Windsor, NJ (US); Stewart MCDougall, Princeton, NJ (US)

(73) Assignee: TRUMPF PHOTONICS, INC., Cranbury (JE)

( * ) Notice: Subject to any disclaimer, the term of this patent is extended or adjusted under 35 U.S.C. 154(b) by 382 days.

(21) Appl. No.: 18/479,122

(22) Filed: Oct. 2, 2023

(65) Prior Publication Data

US 2025/0112212 A1 Apr. 3, 2025

(51) Int. Cl.
| | |
|---|---|
| *H01L 25/075* | (2006.01) |
| *H01L 25/16* | (2023.01) |
| *H01L 33/00* | (2010.01) |
| *H01L 33/48* | (2010.01) |
| *H01L 33/64* | (2010.01) |
| *H01S 5/024* | (2006.01) |
| *H01S 5/40* | (2006.01) |
(Continued)

(52) U.S. Cl.
CPC ......... *H10W 90/00* (2026.01); *H01S 5/02423* (2013.01); *H01S 5/4018* (2013.01); *H01S 5/4025* (2013.01); *H01S 5/4031* (2013.01); *H01S 5/405* (2013.01); *H10H 20/012* (2025.01); *H10H 20/8506* (2025.01); *H10H 20/8583* (2025.01)

(58) Field of Classification Search
CPC ............ H01L 25/0753; H01L 25/0756; H10H 20/012; H10H 20/8583; H10H 20/8585; H10H 20/8586; H01S 5/023; H01S 5/02315; H01S 5/02423; H01S 5/4018; H01S 5/4025; H01S 5/4031; H01S 5/405; H01S 5/024; H01S 5/02407
USPC .................................................. 372/50.12, 35
See application file for complete search history.

(56) References Cited

U.S. PATENT DOCUMENTS

| | | | | |
|---|---|---|---|---|
| 5,105,430 A | * | 4/1992 | Mundinger | ......... H01S 5/02423 372/50.1 |
| 5,734,672 A | * | 3/1998 | McMinn | ............... H01S 5/4025 372/50.12 |

(Continued)

OTHER PUBLICATIONS

International Searching Authority, Written Opinion of the International Searching Authority, International application No. PCT/US2024/049519, Jan. 21, 2025, all pages. (Year: 2025).*

(Continued)

*Primary Examiner* — Victoria K. Hall
(74) *Attorney, Agent, or Firm* — LEYDIG, VOIT & MAYER, LTD.

(57) ABSTRACT

A light emitting device includes a plurality of light emitting diode stacks and a cooler. The plurality of light emitting diode stacks are each mounted to and cooled by the cooler. A light emitting device includes a plurality of light emitting diode stacks, a cooler, and a power supply. The plurality of light emitting diode stacks are each mounted to and cooled by the cooler, the power supply is configured to power the plurality of light emitting diode stacks, and the power supply is mounted to the cooler on an opposite side of the cooler relative to the plurality of light emitting diode stacks.

16 Claims, 8 Drawing Sheets

(51) Int. Cl.

| | | |
|---|---|---|
| H10H 20/01 | (2025.01) | |
| H10H 20/85 | (2025.01) | |
| H10H 20/858 | (2025.01) | |
| H10W 90/00 | (2026.01) | |

(56) References Cited

U.S. PATENT DOCUMENTS

| | | |
|---|---|---|
| 2004/0114355 A1 | 6/2004 | Rizkin et al. |
| 2010/0127299 A1 | 5/2010 | Smith et al. |
| 2016/0133410 A1 | 5/2016 | Bock et al. |
| 2021/0126426 A1 | 4/2021 | Tillkorn et al. |
| 2024/0283214 A1* | 8/2024 | Vethake ................ H01S 5/4031 |

OTHER PUBLICATIONS

International Searching Authority, International Search Report, International application No. PCT/US2024/049519, Jan. 21, 2025, all pages. (Year: 2025).*

* cited by examiner

30

10

30

10

DIODE WALL INTEGRATED ON COOLER

FIELD

The present invention relates to a wall of high accuracy laser diode stacks integrated on a cooler.

BACKGROUND

Quasi-continuous wave (QCW) lasers are assembled as stacks of parallel edge-emitting diodes. The QCW laser stacks include subassemblies with submounts and diodes that are joined to one another to form the stack. Stacks may then be combined to form a wall of QCW laser stacks for combined light output. Typically, each individual stack that makes up the diode wall is mounted on a separate cooler.

SUMMARY

In an embodiment, the present disclosure provides a light emitting device, comprising a plurality of light emitting diode stacks and a cooler, wherein the plurality of light emitting diode stacks are each mounted to and cooled by the cooler.

In an embodiment, the present disclosure provides a light emitting device comprising a plurality of light emitting diode stacks, a cooler, and a power supply. The plurality of light emitting diode stacks are each mounted to and cooled by the cooler. The power supply is configured to power the plurality of light emitting diode stacks. The power supply is mounted to the cooler on an opposite side of the cooler relative to the plurality of light emitting diode stacks.

In an embodiment, the present disclosure provides a method for emitting light from a plurality of light emitting diodes, the method comprising forming a plurality of emitter subassemblies, each emitter subassembly including a plate-shaped light emitter having two sides and configured to emit light from an edge disposed between the two sides, and at least one plate-shaped submount attached to at least one side of the plate-shaped light emitter. The method further comprises forming a plurality of light emitting diode stacks by arranging a plurality of the emitter subassemblies disposed parallel to one another and mounting the plurality of light emitting diode stacks on a cooler to form an array of light emitting diode stacks.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
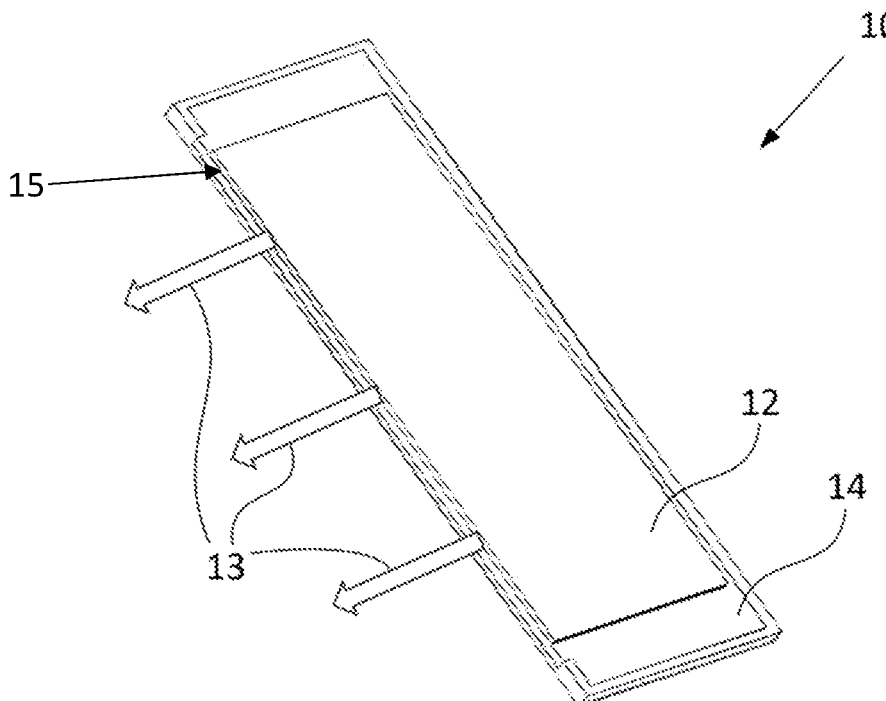
FIG. 1 illustrates a diode and submount according to an aspect of the disclosure.

Conventional diode walls with separately mounted and cooled stacks lead to increased assembly costs, as such diode walls increase the number of cooler inlet and outlet connections that must be made and maintained. Conventional diode walls are also thus complex, bulky, and include a high quantity of parts. Furthermore, such diode walls require correspondingly complex cooling fluid supply systems and demand high electrical currents from external power supplies, sometimes through expensive and/or complicated busbars. Embodiments of the present disclosure provide improvements to diode walls that address the foregoing drawbacks.

Embodiments of the present disclosure are directed to two or more laser stacks that are integrated on a single cooler to form at least part of a diode wall, thereby providing a diode wall that is more cost-effectively produced and assembled, has fewer components, and has a reduced size in comparison to conventional diode walls. Diode walls according to some embodiments of the present disclosure further reduce costs by simplifying the cooling and electrical supply systems that are required to cool and power the diode walls. Diode walls according to some embodiments of the present disclosure eliminate the need for expensive and complicated busbars or other electrical connections that extend from within a diode wall assembly to an external environment, as an integrated power supply may be provided to require only lower-power electrical connections from a diode wall assembly to external components. By simplifying diode walls, embodiments of the present invention also reduce maintenance complexity and cost and improve diode wall safety, as high electrical currents are contained within a diode wall assembly and do not need to be routed from an external source.

In an embodiment, a plurality of laser stacks may be integrated on a single cooler and arranged to form an array of laser stacks. The array of laser stacks has an m×n size, with m representing the number of rows of the array (and thus the number of laser stacks in each column of the array) and n representing the number of columns of the array (and thus the number of laser stacks in each row of the array). It will be readily appreciated that the laser stacks forming the array may be arranged in more than one orientation without departing from the spirit of the present invention. For example, in an embodiment in which each laser stack is longer than it is wide when viewed from the emitter-side of the stack, the length of each laser stack may be oriented parallel to the rows or parallel to the columns of a laser array without departing from the spirit of the present invention.

Embodiments of the present disclosure provide various arrangements of laser stacks integrated on a single cooler to form a diode wall. In order to ensure the laser stacks of the diode wall are each properly supplied with electrical current, various direct bonded copper (DBC) substrate track configurations are employed. The particular DBC tracks configurations eliminate the need for multiple standalone power supply units, which are conventionally used when laser stacks are separately mounted to individual coolers to form conventional diode walls. As a result, the need for high energy electrical pulses to diodes of the laser stacks via busbars is also eliminated.

Embodiments of the present disclosure further provide improved diode wall efficiency and increased laser brightness, as individual alignment of laser stacks within a diode wall is not required if the entire diode wall assembly can be aligned to a single target. Specifically, embodiments of the present invention allow for use of absolute tolerancing, as the metallization of the cooler and/or a lens array can be designed with spacing that matches the location of laser stacks in a laser array, and thus can also match the spacing of individual emitters within laser stacks. This also enables passive alignment or alignment of a single lens array covering multiple laser stacks, which significantly simplifies an assembly process over conventional systems in which lenses are individually aligned to each emitter in a stack or lens arrays are limited to alignment within a single stack.

In an embodiment, an integrated power supply is further provided in a diode wall such that low amounts of energy can be drawn into an integrated storage, after which stored energy can be released based on a trigger signal. As a result, electrical pulse signals travel only short distances and associated distorting effects are reduced. Furthermore, because a power supply can be integrated, smaller and cheaper electrical power lines may be used both to provide energy for storage and to provide control signaling for integrated power supplies.

FIG. 1 illustrates a first emitter subassembly 10 comprising a laser diode 12 joined to a submount 14. The laser diode 12 has a substantially planar configuration and emits light along an emitting edge 15 in an emitting direction 13 away from the emitting edge 15 of the laser diode 12. Although the laser diode 12 generally emits light in the emitting direction, it will be readily understood that light emitted from laser diode 12 is not focused in an exact direction, as light rays are emitted in a scattered fashion from the emitting edge 15 and must be focused by a lens mounted at or near the emitting edge 15. The emitting direction 13 thus represents a generalized direction for purposes of describing embodiments of the present disclosure, and is not understood to represent the direction of all light emitted from laser diode 12.

The submount 14 is a structural member configured to receive a laser diode 12 and provide structural rigidity to a laser stack created using emitter subassemblies, as will be described in greater detail hereafter. In addition to providing structural rigidity and a mounting surface for a laser diode 12, the submount also serves to transfer heat from a laser diode while protecting the laser diode from the external environment. Thus, the submount 14 is preferably formed from a material with a very high thermal conductivity to transfer heat away from the laser diode 12. Furthermore, the submount 14 is configured such that only low mechanical stresses occur between the laser diode 12 and the submount 14 to which it is joined, as will be described hereafter. The submount 14 may comprise copper tungsten (CuW) or other materials with similar properties to copper tungsten or as described above. The submount 14 also includes an opening through which a mounted laser diode 12 may emit light via emitting edge 15.

A laser diode 12 may be joined to the submount 14 via a variety of processes. In an embodiment, the laser diode 12 is joined to the submount 14 via sintering. This ensures rigid joining of the laser diode 12 to the submount 14, strong thermal conduction between the laser diode 12 and submount 14, and greater precision in tolerances of an assembled first emitter subassembly 10 than are achieved in other processes, such as soldering. The laser diode 12 may be joined to the submount 14 on a P-side (or anode) of a laser diode comprising the laser diode 12.

Figure 2:
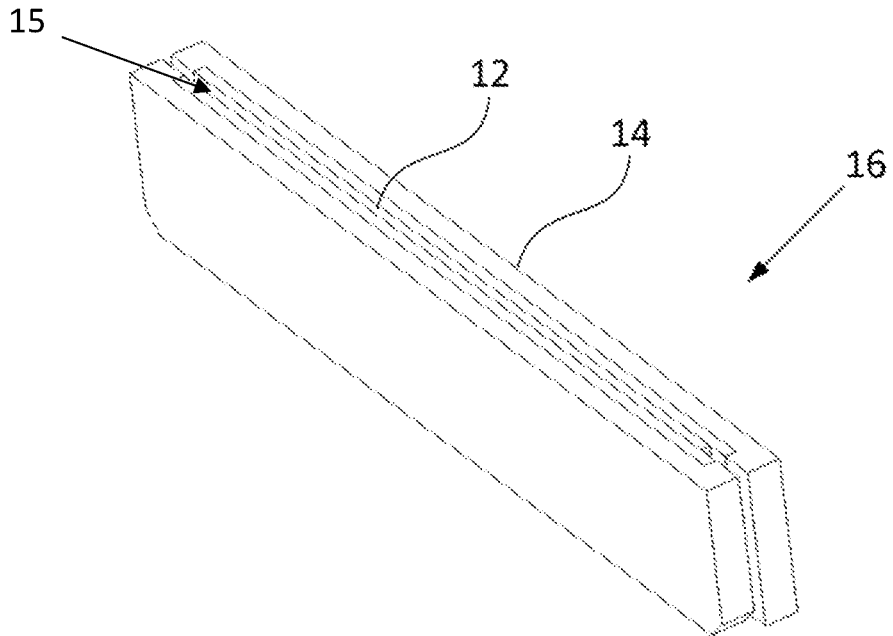
FIG. 2 illustrates an emitter subassembly according to an aspect of the disclosure.

FIG. 2 illustrates a second emitter subassembly 16. The second emitter subassembly 16 is similar to the first emitter subassembly 10 in that it likewise includes a laser diode 12 mounted to a submount 14. However, the second emitter subassembly further comprises a second submount 14, thereby sandwiching a laser diode 12 between submounts 14. As a result, the second emitter subassembly as a standalone unit encases a laser diode while providing an opening through which the emitting edge 15 of the laser diode 12 may emit light. In some embodiments, the laser diode 12 may be joined to the second submount 14 of the second emitter subassembly 16 on an N-side (or cathode) of the laser diode 12.

Figure 3:
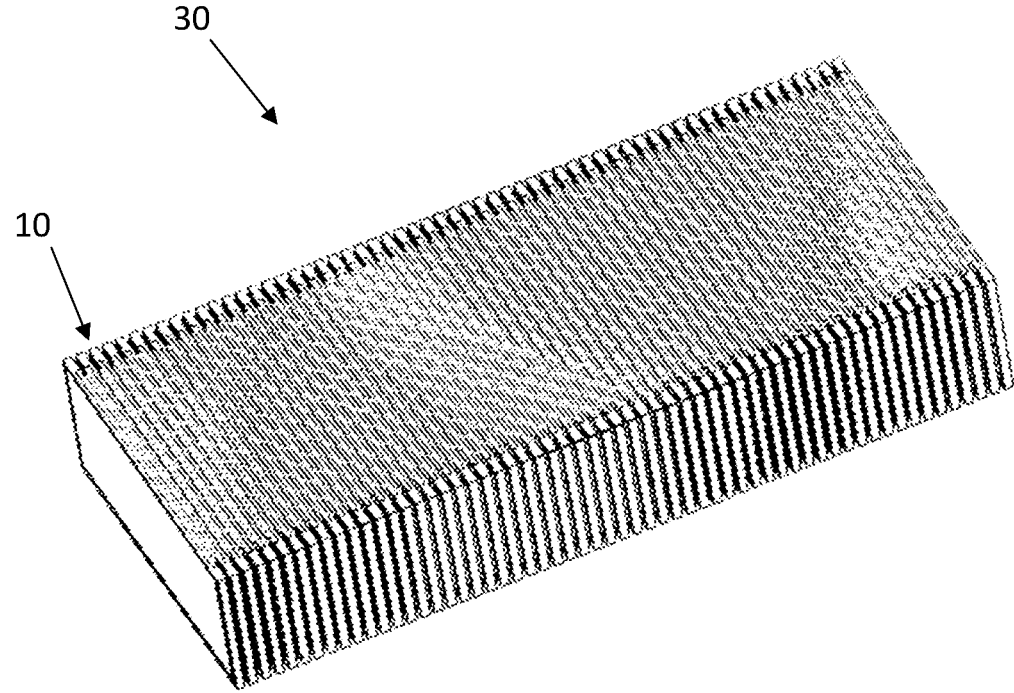
FIG. 3 illustrates a perspective view of a laser stack according to an aspect of the disclosure.

FIG. 3 illustrates a laser stack 30 according to an embodiment of the disclosure. The laser stack 30 includes a series of first emitter subassemblies 10 joined together in parallel so that all emitting edges of the first emitter subassemblies 10 face the same general direction on one face of the stack. The stack is formed so that the light output of each emitter subassembly may be combined and concentrated in a smaller footprint to form a high power laser. In some embodiments, a laser stack 30 may instead be configured to include a series of second emitter subassemblies 16 joined together, with adjacent second emitter subassemblies 16 being joined via their submounts 14. One or both of the foregoing embodiments may be used in laser stacks employed according to the present disclosure.

Figure 4:
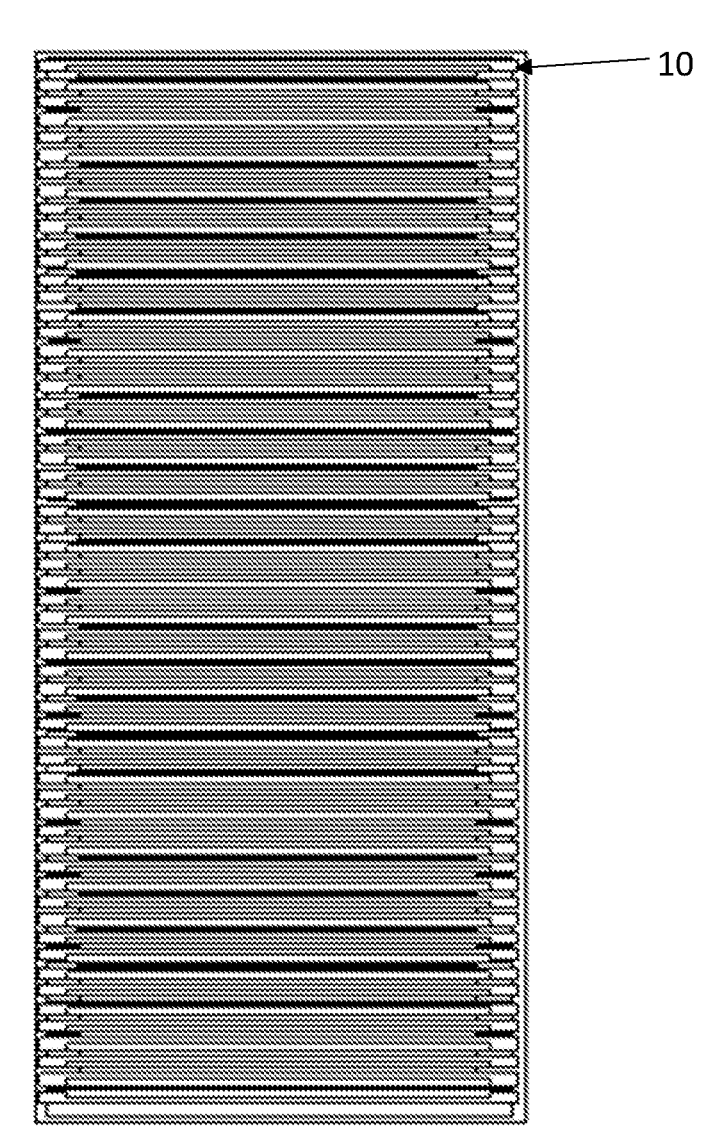
FIG. 4 illustrates a top view of a laser stack according to an aspect of the disclosure.

FIG. 4 illustrates a laser stack 30 in a top-down view facing the emitting edges of emitter subassemblies. It will be readily appreciated that a laser stack may be formed according to the present disclosure with a variety of configurations that are consistent with the illustrated embodiment. For example, the dimensional proportions of the laser stack may vary depending on a particular laser stack specification. Likewise, the number of individual subassemblies that are combined to form a laser stack may vary.

Figure 5:
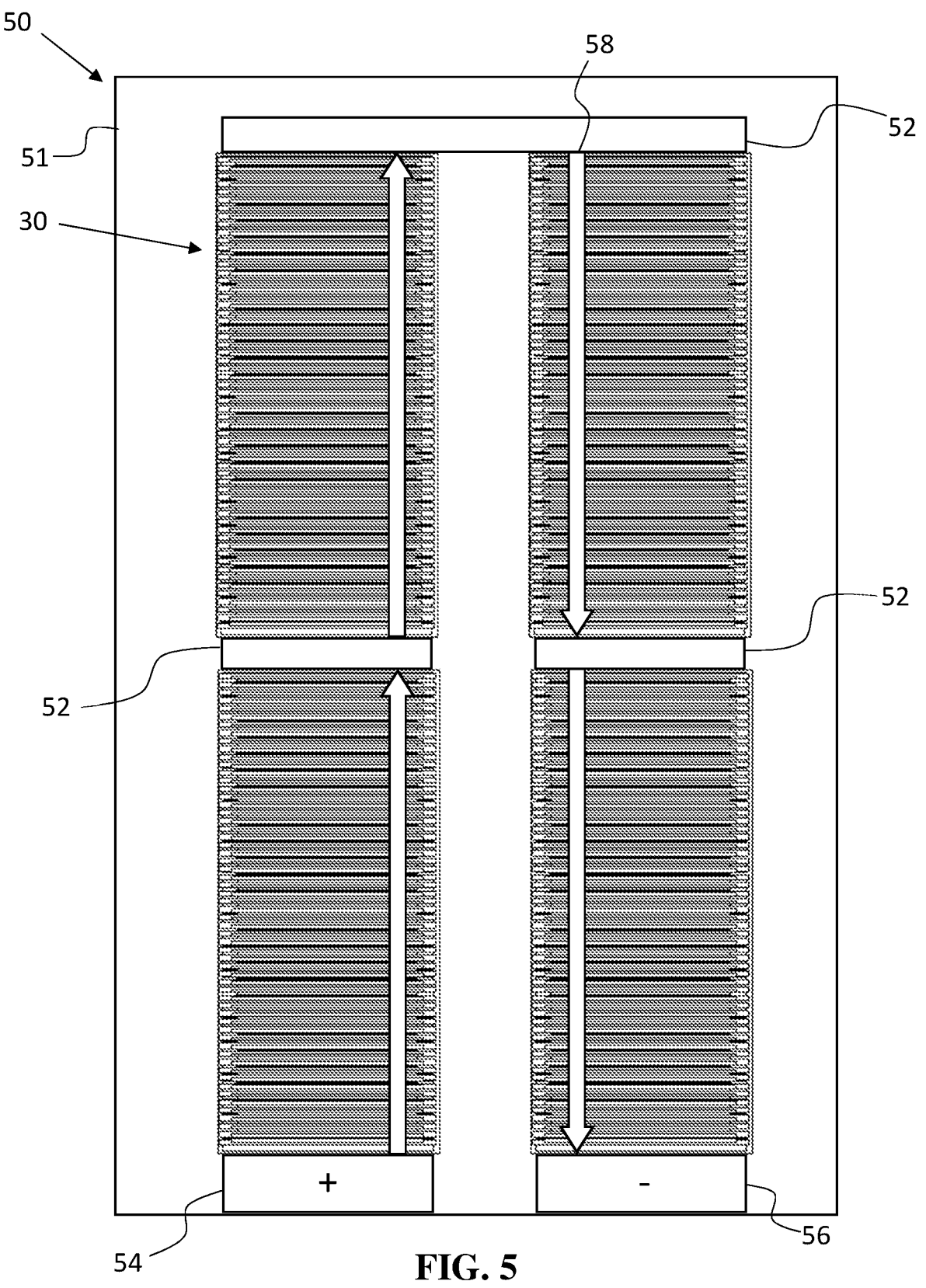
FIG. 5 illustrates a diode wall integrated on a cooler according to an aspect of the disclosure.

FIG. 5 illustrates a diode wall 50 integrated on a single cooler 51 according to an embodiment of the present disclosure. The diode wall 50 is formed by arranging a plurality of laser stacks 30 to form an array, the array having m rows and n columns. Reference will be made to individual laser stacks in the array illustrated in the Figures by referring to their position within the array. For example, the laser stack in the first row from the top and the leftmost column is referred to as laser stack (1,1), the laser stack in the top row on the right is referred to as laser stack (1,2), the laser stack in the bottom row on the left is referred to as laser stack (2,1), and the laser stack in the bottom row on the right is referred to as laser stack (2,2). It will be readily appreciated that although FIG. 5 illustrates four laser stacks 30 forming a 2×2 array, that other arrays with varying numbers of rows and columns may be utilized without departing from the spirit of the present disclosure.

Electrical current is passed through each of the laser stacks 30 using DBC substrates. Specifically, a plurality of cooler top metallizations 52, 54, 56 are used to direct current to achieve the illustrated current directions as illustrated by arrows 58 through each of the laser stacks 30. A positive metallization 54 and negative metallization 56 are used to create an electrical potential between the laser stacks 30 of the laser array. Intermediate metallizations 52 are used to direct current from a first laser stack connected to the positive metallization 54 to a second laser stack and to subsequently connected laser stacks. In the embodiment illustrated in FIG. 5, laser stack (2,1) is connected to the positive metallization 54, with laser stack (1,1), laser stack (1,2), and laser stack (2,2) subsequently arranged in series with laser stack (2,1) using intermediate metallizations 52. The downstream end of laser stack (2,2) is connected to negative metallization 56. As a result, electrical current flows through each of the laser stacks in series in the order (2,1), (1,1), (1,2), and (2,2). It will be readily appreciated that the illustrated pattern may be modified to accommodate more rows and/or columns in a laser array by providing intermediate metallizations 52 that connect the same end of laser stacks 30 that are in the same row and at the same end of respective columns of the array. The resulting current path of any array having more than one column according to such an embodiment would have an undulating pattern that travels along columns from one end of the rows of laser stacks to the opposing end of the rows of laser stacks.

Because the laser stacks 30 are integrated on a single cooler 51, each of the laser stacks 30 do not require separate mounting to separate coolers, and subsequent assembly of separate stack and cooler combinations is not required to form the diode wall 50. Furthermore, metallizations 52, 54, 56 enable electrical current to pass through all laser stacks 30 of the diode wall 50 without requiring separate power supply connections for each laser stack.

Figure 6:
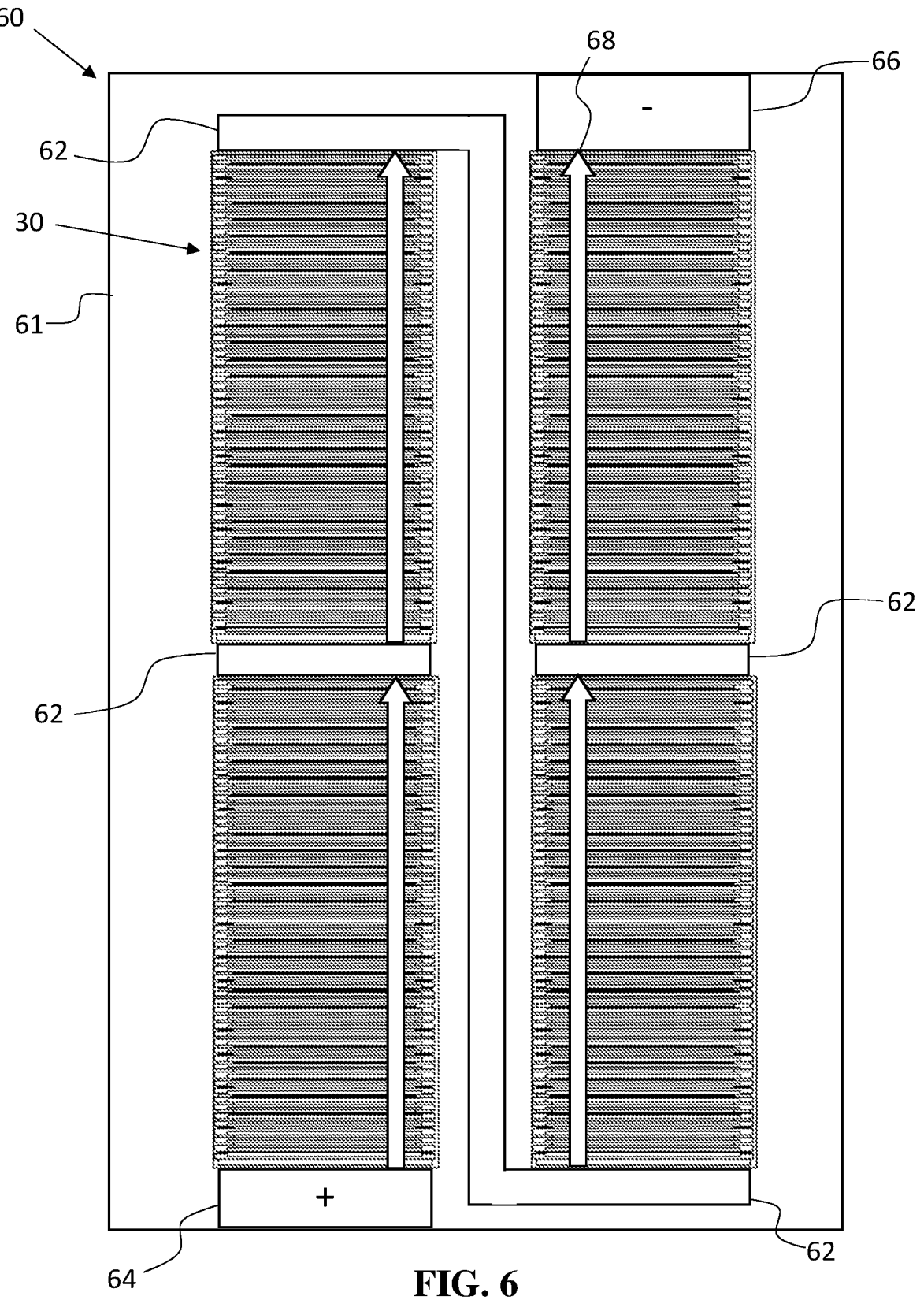
FIG. 6 illustrates a diode wall integrated on a cooler according to an aspect of the disclosure.

FIG. 6 illustrates another embodiment of a diode wall 60 integrated on a cooler 61 according to the present disclosure. The diode wall 60 is similar to the configuration illustrated in FIG. 5 in that each of the laser stacks 30 of the diode wall are electrically connected in series. However, in contrast to the configuration illustrated in FIG. 5, an intermediate metallization 62 between columns of laser stacks 30 is used to connect laser stacks (1,1) and (2,2) such that the direction of electrical current flow 68 through each of the laser stacks 30 is in the same direction from positive metallization 64 to intermediate metallization 62 and then to negative metallization 66. To accomplish this, negative metallization 66 is connected to laser stack (1,2) and the laser stacks 30 are electrically configured in series in the order (2,1), (1,1), (2,2), and (1,2). It will be readily appreciated that the illustrated pattern may be modified to accommodate more rows and/or columns in a laser array by providing intermediate metallizations 62 that connect opposite ends of laser stacks situated on opposite rows and adjacent columns of the array. The resulting overall electrical current path is similar to that of the embodiment of FIG. 5. However, the undulating pattern passes between columns of laser stacks such that the electrical current path through each of the laser stacks 30 of the array is oriented in the same direction.

Figure 7:
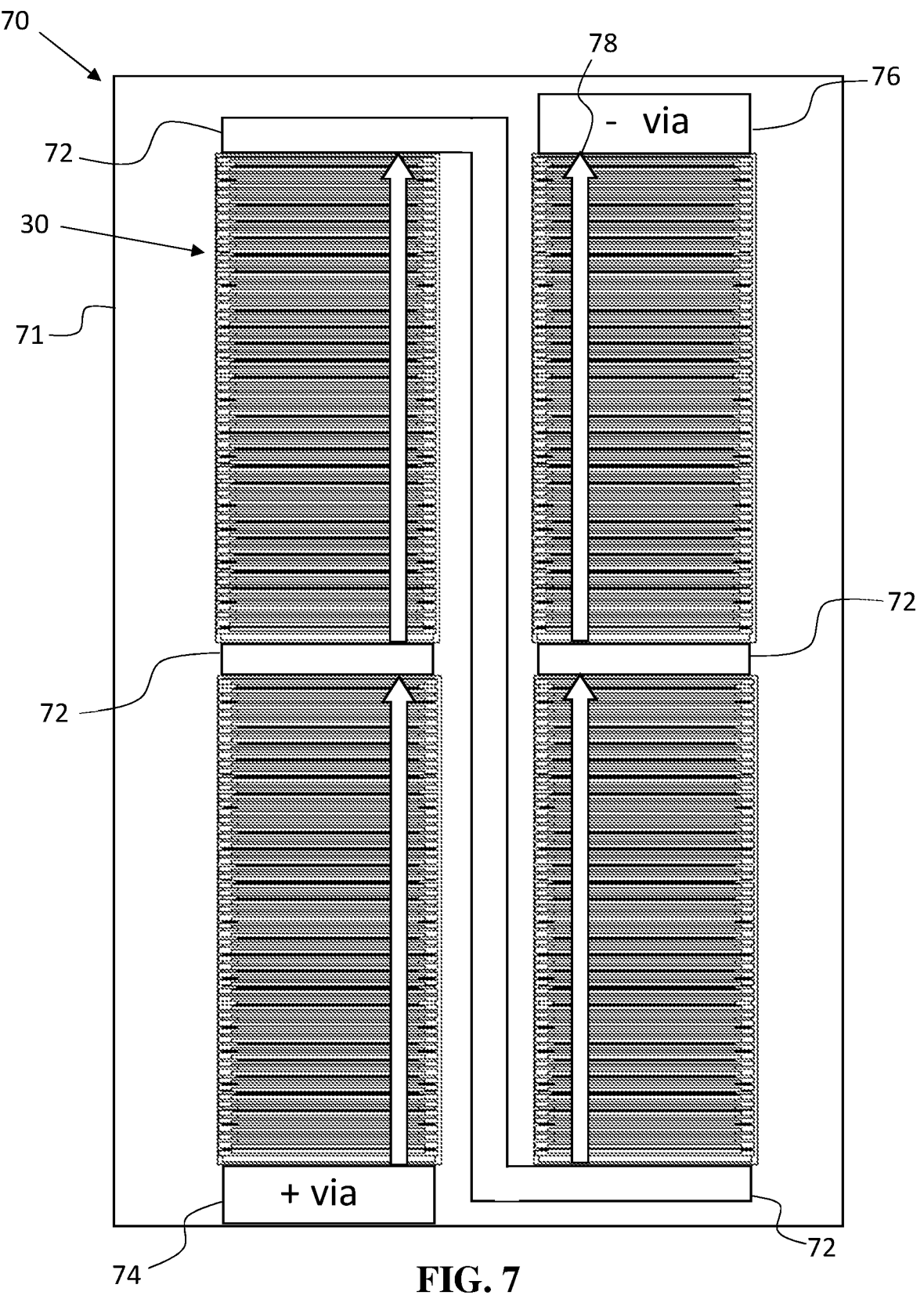
FIG. 7 illustrates a diode wall integrated on a cooler according to an aspect of the disclosure.

FIG. 7 illustrates another embodiment of a diode wall 70 integrated on a cooler 71 according to the present disclosure. The configuration of metallizations 72, 74, 76 is similar to those illustrated in FIG. 6, except that positive metallization 74 and negative metallization 76 include via connections. Accordingly, the laser stacks 30 of the illustrated embodiment are electrically connected in series and electrical current passes through each laser stack 30 in the same direction in similar fashion to the embodiment of FIG. 6, as described above and indicated by arrow 78.

Figure 8:
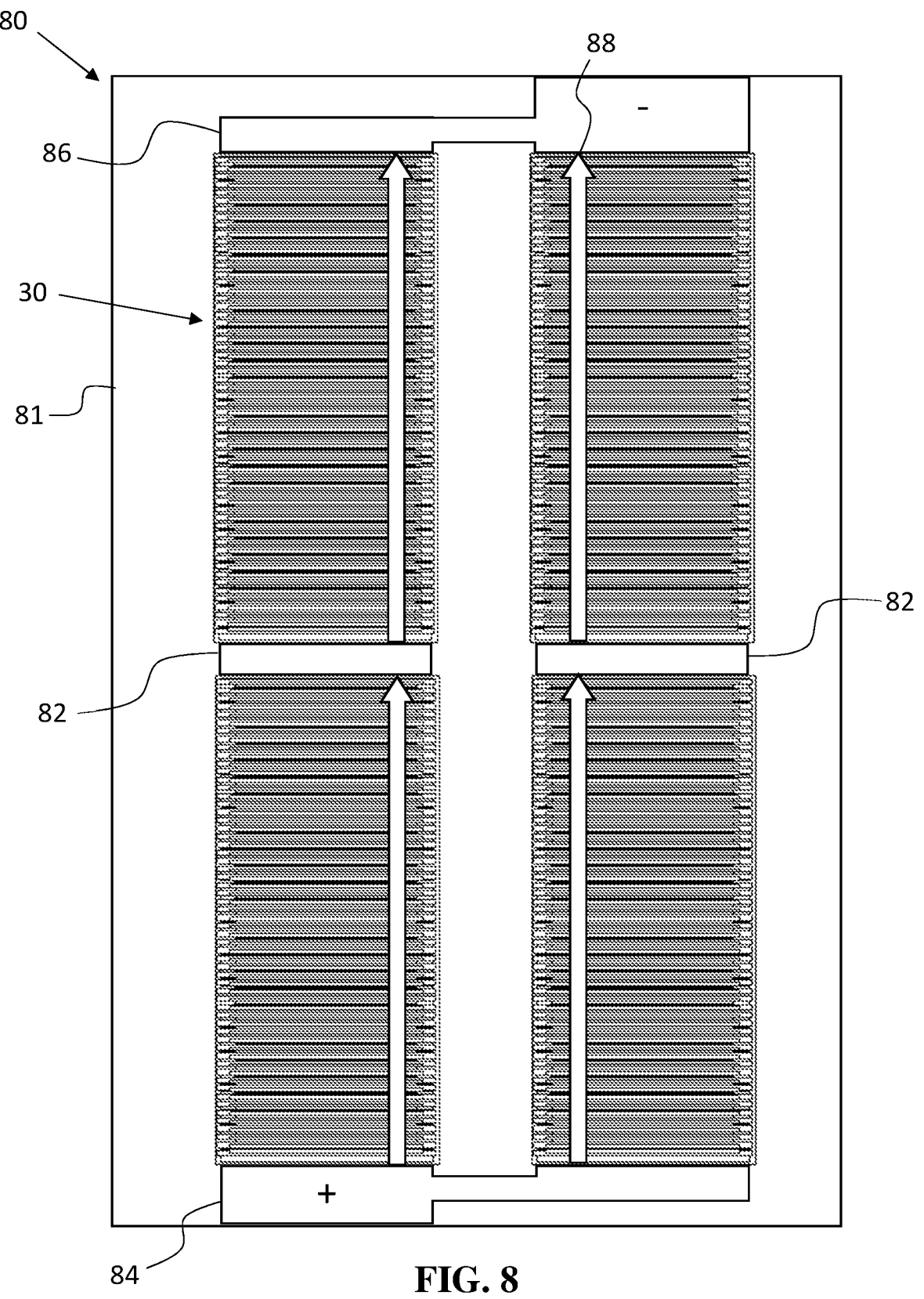
FIG. 8 illustrates a diode wall integrated on a cooler according to an aspect of the disclosure.

FIG. 8 illustrates another embodiment of a diode wall 80 integrated on a cooler 81 according to the present disclosure. In this embodiment, laser stacks 30 of the laser array are connected using both series and parallel connections, thereby providing for an electrical current that passes in the same direction (as indicated by arrow 88) through each of the laser stacks 30. However, unlike the embodiments illustrated in FIGS. 6 and 7, a long intermediate metallization between columns of laser stacks in the array can be avoided, thereby providing a simplified cooler top metallization layer. Specifically, in the illustrated embodiment, a positive metallization 84 is arranged at one end of laser stack (2,1) and a negative metallization 86 is arranged at an opposite end of laser stack (1,2). Laser stack (2,1) is connected in parallel with laser stack (2,2) via positive metallization 84 and in series with laser stack (1,1). Laser stack (1,1) is connected in parallel with laser stack (1,2) and also thus also connected directly to the negative metallization 86. Laser stack (2,2) is connected in series with laser stack (1,2). It will be readily appreciated that the illustrated pattern may be modified to accommodate more rows and/or columns in a laser array by providing intermediate metallizations 82 that connect laser stacks of a column in series along each respective column, and also by providing a direct connection of laser stacks along the row at each end of the columns.

The illustrated embodiments show various types of electric connections between the laser stacks, and may be used depending on the use case or specifications of a particular laser array. In a first connection type, serial electrical connections are provided between laser stacks with a change of electrical current direction from the P-side to the N-side of diodes within laser stacks. In a second connection type, serial electrical connections are provided between laser stacks while maintaining the direction of electrical current through all diodes in the laser stacks. In a third connection type, parallel electrical connections are provided between laser stacks while maintaining the direction of electrical current through all diodes in the laser stacks. In a fourth connection type, parallel electrical connections are provided between laser stacks with a change of electrical current from the P-side to the N-side of diodes within laser stacks.

In some embodiments, the number of laser stacks integrated on a single cooler may range from 2-20 laser stacks. In some embodiments, more than 20 laser stacks may be arranged in an array consistent with embodiments illustrated and described above.

Figure 9:
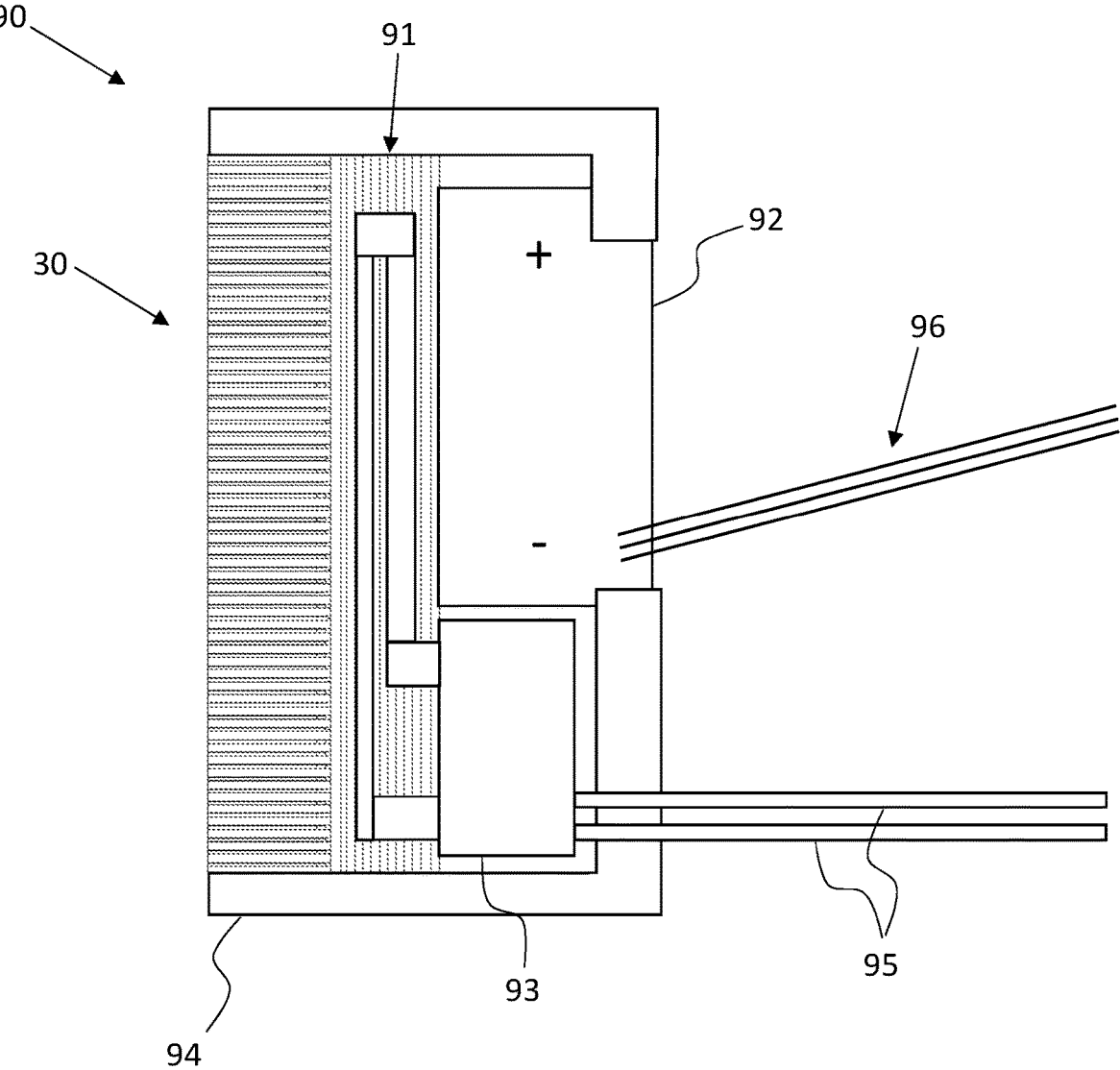
FIG. 9 illustrates a schematic cross-sectional view of a diode wall with an integrated power supply according to an aspect of the disclosure.

FIG. 9 illustrates a schematic cross-sectional view of a diode wall 90 with an integrated power supply 92. The diode wall 90 includes at least one laser stack 30 mounted on a cooler 91. It will be readily appreciated that FIG. 9 is an exemplary schematic illustration, and thus should not be construed as being limited to only diode walls with one laser stack. Rather, diode wall 90 may include a plurality of laser stacks 30 and may likewise incorporate the diode walls according to any of FIGS. 5-8 or other embodiments as described above. The cooler 91 includes a water manifold 93 that receives water supplied through water supply lines 95. The water is circulated within the cooler 91, which includes a thermally conductive material configured to facilitate exchange of heat from the diodes within the laser stack 30 to the water. It will be readily appreciated that other cooling fluids of varying composition may also be used instead of water within the spirit of the present disclosure and consistent with the purpose of the cooler 91, which uses thermal heat exchange to cool diodes within the laser stack 30.

The diode wall 90 includes metallization layers 94 configured to conduct electricity between a custom integrated power supply 92 and the diodes of the laser stack 30. The integrated power supply 92 is configured to provide bursts of electrical current as high energy pulses, which may include peak currents of 600 amps per stack. The integrated power supply 92 stores electrical energy supplied to the custom power supply via two of three wires 96 that are configured as power supply wires to provide a low amount of energy to be stored in the integrated power supply 92. Because the integrated power supply 92 stores energy and releases it in high energy pulses, the power supply wires 96 of the integrated power supply 92 do not have to carry the full instantaneous electrical current required to power the diodes of the laser stack or laser stacks 30. As a result, power supply wires 96 rated for less current can be used to provide power between the diode wall 90 and an external power source. This advantageously reduces the cost of wiring required to supply power to a diode wall 30, which otherwise may include an external power supply and thus necessitate complex and/or expensive wiring and busbars to transfer high operating currents to the diode wall during illumination of its diodes. The wires 96 also include a trigger signal wire, which is used to trigger output of the high energy pulses from the integrated power supply 92. Because trigger signals require very low amounts of electrical power in comparison to power supply output or high energy pulse power, the trigger signal wire may also be selected from a host of cheaper and readily available components, further enabling use of wires 96 that are inexpensive, simple, and less cumbersome than in conventional solutions.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A light emitting device, comprising:
a plurality of light emitting diode stacks; and
a cooler,
wherein the plurality of light emitting diode stacks are each mounted to and cooled by the cooler,
wherein the plurality of light emitting diode stacks are arranged to form an array including at least two rows and at least two columns.

2. The light emitting device of claim 1, wherein each of the plurality of light emitting diode stacks comprises a plurality of emitter subassemblies, each emitter subassembly including:

a plate-shaped light emitter having two sides and configured to emit light from an edge disposed between the two sides, and
at least one plate-shaped submount attached to at least one side of the plate-shaped light emitter,
wherein each of the plurality of emitter subassemblies are disposed parallel to one another to form a respective one of the plurality of light emitting diode stacks.

3. The light emitting device of claim 1, further comprising direct bonded copper (DBC) substrate tracks configured to conduct electrical current through the plurality of light emitting diode stacks.

4. The light emitting device of claim 3, wherein the plurality of light emitting diode stacks are electrically connected in series.

5. The light emitting device of claim 4, wherein electrical current is configured to pass through columns of the array of light emitting diode stacks in alternating directions to form an undulating current path.

6. The light emitting device of claim 3, wherein the DBC substrate tracks are configured to connect adjacent rows or columns of the array of light emitting diodes stacks such that electrical current is configured to pass through each of the light emitting diode stacks in a same direction.

7. The light emitting device of claim 3, wherein the DBC substrate tracks include a positive track and a negative track, and wherein the positive and negative tracks are each configured as a via.

8. The light emitting device of claim 3, wherein columns of the array of light emitting diode stacks are electrically connected in parallel such that electrical current is configured to pass through columns of the array of light emitting diode stacks in a same direction.

9. The light emitting device of claim 3, further comprising an integrated power supply that is electrically connected to the DBC substrate tracks and configured to supply electrical current to the plurality of light emitting diode stacks.

10. The light emitting device of claim 9, wherein the integrated power supply is configured to store electrical power received via power supply lines and discharge power to the plurality of light emitting diode stacks via high energy pulses.

11. The light emitting device of claim 10, wherein the power supply lines are not rated to provide instantaneous electrical current sufficient to power the plurality of light emitting diode stacks.

12. The light emitting device of claim 10, further comprising a trigger signal line configured to transmit a trigger signal to the integrated power supply.

13. A light emitting device comprising:
a plurality of light emitting diode stacks;
a cooler; and
a power supply,
wherein the plurality of light emitting diode stacks are each mounted to and cooled by the cooler,
wherein the power supply is configured to power the plurality of light emitting diode stacks,
wherein the power supply is mounted to the cooler on an opposite side of the cooler relative to the plurality of light emitting diode stacks, and
wherein the power supply is configured to store electrical power received via power supply lines and discharge power to the plurality of light emitting diode stacks via high energy pulses.

14. The light emitting device of claim 13, wherein the power supply lines are not rated to provide instantaneous electrical current sufficient to power the plurality of light emitting diode stacks.

15. The light emitting device of claim 13, further comprising a trigger signal line configured to transmit a trigger signal to the power supply.

16. A method for emitting light from a plurality of light emitting diodes, the method comprising:

forming a plurality of emitter subassemblies, each emitter subassembly including:

a plate-shaped light emitter having two sides and configured to emit light from an edge disposed between the two sides, and at least one plate-shaped submount attached to at least one side of the plate-shaped light emitter;

forming a plurality of light emitting diode stacks by arranging a plurality of the emitter subassemblies disposed parallel to one another;

mounting the plurality of light emitting diode stacks on a cooler to form an array of light emitting diode stacks; and forming direct bonded copper (DBC) substrate tracks configured to conduct electrical current through the plurality of light emitting diode stacks.

* * * * *